United States Patent
Choi et al.

(10) Patent No.: US 9,502,639 B2
(45) Date of Patent: Nov. 22, 2016

(54) ELECTRONIC DEVICE FOR IMPROVING CHARACTERISTIC OF VARIABLE RESISTANCE ELEMENT AND METHOD OF FABRICATING THE SAME

(71) Applicant: SK hynix Inc., Icheon-Si (KR)

(72) Inventors: Won-Joon Choi, Icheon-Si (KR); Ki-Seon Park, Icheon-Si (KR); Cha-Deok Dong, Icheon-Si (KR); Bo-Mi Lee, Icheon-Si (KR); Guk-Cheon Kim, Icheon-Si (KR); Seung-Mo Noh, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/158,702

(22) Filed: Jan. 17, 2014

(65) Prior Publication Data

US 2015/0092480 A1 Apr. 2, 2015

(30) Foreign Application Priority Data

Sep. 30, 2013 (KR) .................. 10-2013-0116109

(51) Int. Cl.
| | | |
|---|---|---|
| *G11C 11/00* | (2006.01) | |
| *H01L 43/02* | (2006.01) | |
| *H01L 43/12* | (2006.01) | |
| *G11C 11/16* | (2006.01) | |
| *H01L 43/08* | (2006.01) | |
| *H01L 45/00* | (2006.01) | |

(52) U.S. Cl.
CPC ............ *H01L 43/02* (2013.01); *G11C 11/161* (2013.01); *H01L 43/08* (2013.01); *H01L 43/12* (2013.01); *H01L 45/04* (2013.01); *H01L 45/06* (2013.01); *H01L 45/12* (2013.01); *H01L 45/1233* (2013.01); *G11C 11/1659* (2013.01)

(58) Field of Classification Search
None
See application file for complete search history.

(56) References Cited

U.S. PATENT DOCUMENTS

| | | | |
|---|---|---|---|
| 2002/0146895 A1* | 10/2002 | Ramdani et al. | 438/497 |
| 2006/0098354 A1* | 5/2006 | Parkin | 360/324.2 |
| 2006/0261425 A1 | 11/2006 | Suemitsu et al. | |
| 2007/0076471 A1 | 4/2007 | Kano et al. | |
| 2007/0297220 A1 | 12/2007 | Yoshikawa et al. | |
| 2010/0074092 A1 | 3/2010 | Zhu et al. | |
| 2010/0080048 A1 | 4/2010 | Liu et al. | |
| 2011/0089507 A1 | 4/2011 | Mao | |
| 2011/0198756 A1* | 8/2011 | Thenappan | C23C 16/18 257/751 |
| 2011/0248235 A1 | 10/2011 | Jeong et al. | |

(Continued)

FOREIGN PATENT DOCUMENTS

| | | |
|---|---|---|
| KR | 1020030000137 A | 1/2003 |
| KR | 1020030054175 A | 7/2003 |

(Continued)

OTHER PUBLICATIONS

USPTO Notice of Allowance and Fees Due for U.S. Appl. No. 14/229,745, mailed Oct. 3, 2014 (12 pages).

(Continued)

*Primary Examiner* — Kretelia Graham
(74) *Attorney, Agent, or Firm* — Perkins Coie LLP

(57) ABSTRACT

An electronic device includes a semiconductor memory, wherein the semiconductor memory includes: a seed layer including conductive hafnium silicate; a first magnetic layer formed over the seed layer; a tunnel barrier layer formed over the first magnetic layer; and a second magnetic layer formed over the tunnel barrier layer.

20 Claims, 7 Drawing Sheets

(56) References Cited

U.S. PATENT DOCUMENTS

| | | |
|---|---|---|
| 2011/0297646 A1 | 12/2011 | deVillers et al. |
| 2012/0092923 A1* | 4/2012 | Bedeschi et al. ............. 365/163 |
| 2012/0326252 A1 | 12/2012 | Yamakawa et al. |
| 2013/0043530 A1 | 2/2013 | Kim et al. |
| 2013/0052826 A1 | 2/2013 | Nepomnishy et al. |
| 2013/0119494 A1 | 5/2013 | Li et al. |
| 2013/0161768 A1 | 6/2013 | Khvalkovskiy et al. |
| 2014/0099735 A1 | 4/2014 | Horng et al. |
| 2014/0327095 A1* | 11/2014 | Kim ....................... H01L 43/08 257/421 |
| 2014/0365688 A1 | 12/2014 | Lee et al. |
| 2015/0162526 A1 | 6/2015 | Lee et al. |
| 2015/0249206 A1 | 9/2015 | Kim et al. |
| 2015/0357557 A1 | 12/2015 | Kim et al. |
| 2016/0180905 A1 | 6/2016 | Kim et al. |
| 2016/0181514 A1 | 6/2016 | Kim et al. |

FOREIGN PATENT DOCUMENTS

| | | |
|---|---|---|
| KR | 1020040005472 A | 1/2004 |
| KR | 1020060000878 A | 1/2006 |
| KR | 100641500 B1 | 10/2006 |
| KR | 1020060118311 A | 11/2006 |
| KR | 1020070036704 A | 4/2007 |
| KR | 1020070054551 A | 5/2007 |
| KR | 1020090038809 A | 4/2009 |
| KR | 1020100005449 A | 1/2010 |
| KR | 1020100030054 A | 3/2010 |
| KR | 1020100128219 A | 12/2010 |
| KR | 101073132 B1 | 6/2011 |
| KR | 101055595 B1 | 8/2011 |
| KR | 1020120047356 A | 5/2012 |
| KR | 1020120058113 A | 6/2012 |
| KR | 101171387 B1 | 7/2012 |
| KR | 1020120078631 A | 7/2012 |
| KR | 101209328 B1 | 11/2012 |
| KR | 1020130069097 A | 6/2013 |
| KR | 1020140011138 A | 1/2014 |
| KR | 1020140025165 A | 3/2014 |

OTHER PUBLICATIONS

USPTO Non-Final Office Action issued for U.S. Appl. No. 14/295,229, mailed May 22, 2015 (14 pages).

USPTO Non-Final Office Action issued for U.S. Appl. No. 14/295,229, mailed Oct. 11, 2016 (23 pages).

USPTO Non-Final Office Action issued for U.S. Appl. No. 14/621,646, mailed Sep. 15, 2016 (10 pages).

* cited by examiner

SWITCHING UNIT

SWITCHING UNIT

ELECTRONIC DEVICE FOR IMPROVING CHARACTERISTIC OF VARIABLE RESISTANCE ELEMENT AND METHOD OF FABRICATING THE SAME

CROSS-REFERENCE TO RELATED APPLICATIONS

The present application claims priority of Korean Patent Application No. 10-2013-0116109, entitled "ELECTRONIC DEVICE AND METHOD FOR FABRICATING THE SAME" and filed on Sep. 30, 2013, which is incorporated herein by reference in its entirety.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, a resistive random access memory (RRAM), a phase-change random access memory (PRAM), a ferroelectric random access memory (FRAM), a magnetic random access memory (MRAM), an E-fuse, etc.

SUMMARY

The disclosed technology in this patent document includes memory circuits or devices and their applications in electronic devices or systems and various implementations of an electronic device which is capable of improving the characteristic of a variable resistance element.

In one aspect, an electronic device includes a semiconductor memory, wherein the semiconductor memory includes: a seed layer including conductive hafnium silicate; a first magnetic layer formed over the seed layer; a tunnel barrier layer formed over the first magnetic layer; and a second magnetic layer formed over the tunnel barrier layer.

Implementations of the above electronic device may include one or more the following.

The seed layer may comprise amorphous conductive hafnium silicate. The conductive hafnium silicate may have an oxygen content of 1% to 10%. The first magnetic layer may comprise an amorphous magnetic material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

In another aspect, a method for fabricating an electronic device includes: forming a seed layer that includes conductive hafnium silicate over a substrate; forming a first magnetic layer over the seed layer; forming a tunnel barrier layer over the first magnetic layer; and forming a second magnetic layer over the tunnel barrier layer.

Implementations of the above electronic device may include one or more the following.

The conductive hafnium silicate may comprise an amorphous state. The conductive hafnium silicate may be formed to have an oxygen content of 1% to 10%. The first magnetic layer may comprise an amorphous magnetic material. The forming of the seed layer may comprise: forming a silicon containing layer over the substrate; forming a hafnium containing layer over the silicon containing layer; and forming the conductive hafnium silicate by reacting the silicon containing layer with the hafnium containing layer through a heat treatment. The silicon containing layer may comprise any one silicon containing layer selected from the group consisting of Si, SiB, SiO, and SiBO. The hafnium containing layer may comprise any one hafnium containing layer selected from the group consisting of Hf, HfO, and HfB. The forming of the seed layer may comprise: forming $Hf_xSi_y$ or $Hf_xSi_yB_z$ over the substrate where x, y, and z are a composition ratio and a natural number; and forming the conductive hafnium silicate by performing an oxidation process on the $Hf_xSi_y$ or $Hf_xSi_yB_z$. The forming of the $Hf_xSi_y$ or $Hf_xSi_yB_z$ may be performed through a sputtering process. The oxidation process may be performed through any one oxidation process selected from the group consisting of natural oxidation, radical oxidation, and plasma oxidation.

In another aspect, a method for fabricating an electronic device includes: forming a variable resistance element including a sequentially stacked structure of a seed layer, a first magnetic layer, a tunnel barrier, and a second magnetic layer; and configuring the seed layer to include a conductive hafnium silicate to suppress the crystallization of the first magnetic layer, thereby increasing a thickness of the first magnetic layer.

Implementations of the above electronic device may include one or more the following.

The forming of the variable resistance element may include forming the seed layer including the conductive hafnium silicate over a substrate in an amorphous state; and forming the first magnetic layer over the seed layer to have an amorphous structure.

The method may further include, in forming the seed layer, including oxygen in the conductive hafnium silicate.

In another aspect, a method for fabricating an electronic device includes: forming a first contact plug over a substrate; forming a variable resistance element including a sequentially stacked structure of a seed layer, a first magnetic layer, a tunnel barrier, and a second magnetic layer such that the seed layer is electrically coupled to the first contact plug; forming a second contact plug over the variable resistance element to be electrically coupled to the variable resistance element; and including conductive hafnium silicate in the seed layer to suppress the crystallization of the first magnetic layer, thereby increasing a thickness of the first magnetic layer.

Implementations of the above electronic device may include one or more the following.

The method may further include forming the seed layer including the conductive hafnium silicate over a substrate in an amorphous state; and forming the first magnetic layer over the seed layer to have an amorphous structure.

The method may further include including oxygen in the conductive hafnium silicate.

In another aspect, an electronic device is provided to include a semiconductor memory that includes a substrate, and a variable resistance element formed over the substrate and including a sequentially stacked structure including a seed layer formed on the substrate, a first magnetic layer over the seed layer, a tunnel barrier over the first magnetic layer, and a second magnetic layer over the tunnel barrier layer. The seed layer includes conductive hafnium silicate and the first magnetic layer has a thickness greater than a thickness when the seed layer does not include the conductive hafnium silicate.

In yet another aspect, an electronic device is provided to include a semiconductor memory that includes a variable resistance element including a seed layer containing conductive hafnium silicate; a first contact plug positioned below the variable resistance element and providing an electrical connection between the variable resistance element and a switching element formed in a substrate; and a second contact plug being positioned above the variable resistance element and providing an electrical connection between the variable resistance element to a conductive line.

These and other aspects, implementations and associated advantages are described in greater detail in the drawings, the description and the claims.

DETAILED DESCRIPTION

Figure 1:
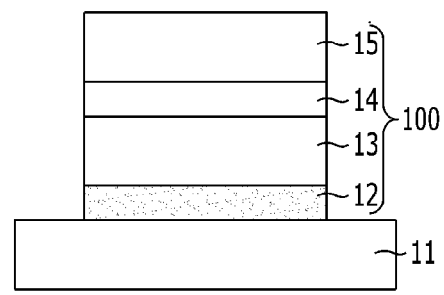
FIG. 1 is a cross-sectional view of a variable resistance element.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The implementations provide a semiconductor device including a variable resistance element capable of improving device characteristics and increasing integration level, and a method for fabricating the same. The variable resistance element has a stacked structure of magnetic layers with a tunnel barrier layer interposed therebetween, and may include a seed layer formed under the magnetic layer so as to improve the anisotropy energy of the magnetic layer. Typically, the seed layer is formed of the same material as the tunnel barrier layer, for example, magnesium oxide (MgO). However, due to a crystallinity difference between MgO and the magnetic layers, an incoherent tunneling effect may occur. Furthermore, tunnel magneto-resistance may be decreased by parasitic resistance, and resistance may be increased. In recognition of the above, the examples of semiconductor devices disclosed below provide a variable resistance element with a seed layer including a conductive hafnium silicate, thereby improving a low resistance characteristic, a TMR (tunneling magnetoresistance) characteristic, and a retention characteristic.

FIG. 1 is a cross-sectional view of an example of a variable resistance element as part of a semiconductor memory.

As illustrated in FIG. 1, the variable resistance element 100 may have a stacked structure of a seed layer 12, a first magnetic layer 13, a tunnel barrier layer 14, and a second magnetic layer 15. The seed layer is formed over a substrate 11 and includes conductive hafnium silicate. Furthermore, although not illustrated, the variable resistance element 100 may include an electrode for applying a bias to the variable resistance element 100. The substrate 11 may include a switching element (not illustrated) and a contact plug (not illustrated) for connecting a junction region of the switching element to the variable resistance element 100.

The variable resistance element 100 having a stacked structure of the seed layer 12, the first magnetic layer 13, the tunnel barrier layer 14, and the second magnetic layer 15 is referred to as a magnetic tunnel junction (MTJ). The variable resistance element 100 having the two magnetic layers 13 and 15 with the tunnel barrier layer 14 interposed therebetween may have a characteristic of switching between different resistance states according to the magnetization directions of the two magnetic layers 13 and 15. For example, when the magnetization directions of the two magnetic layers 13 and 15 are identical to each other (or parallel to each other), the variable resistance element may have a low resistance state, and when the magnetization directions of the two magnetic layers 13 and 15 are different from each other (or anti-parallel to each other), the variable resistance element may have a high resistance state.

The seed layer 12 serves to improve the anisotropy energy of the magnetic layers, and includes amorphous hafnium silicate exhibiting electrical conductivity. Since the conductive hafnium silicate has a metallic property, the conductive hafnium silicate can improve the TMR characteristic while securing low resistance. The conductive hafnium silicate containing oxygen improves the anisotropic characteristic of the subsequent magnetic layer, thereby improving a retention characteristic and a switching characteristic. At this time, the oxygen content of the conductive hafnium silicate may be controlled to range from approximately 1% to approximately 10%. In one embodiment, the conductive hafnium silicate may be formed in an amorphous state. In this case, since a subsequent magnetic layer may also be formed in an amorphous state, the thickness of the magnetic layer may be increased.

The tunnel barrier layer 14 may include a dielectric material, for example, aluminum oxide (AlO) or MgO.

Any one of the first and second magnetic layers 13 and 15 may include a pinned ferroelectric layer of which the magnetization direction is pinned, and the other may include a free ferroelectric layer of which the magnetization direction is varied according to the direction of a current applied to the variable resistance element 100. The magnetic layer may have perpendicular magnetic anisotropy, and may be formed of an amorphous material, for example, CoFeB.

As the seed layer 12 including the amorphous conductive hafnium silicate is formed before the first magnetic layer 13 is formed, the anisotropy energy of the first magnetic layer 13 may be improved to enhance the retention characteristic and the switching characteristic. Furthermore, the conductive hafnium silicate may be applied to secure lower resistance and higher TMR than a similar structure based on an insulating seed layer formed on the substrate. Furthermore, since the amorphous conductive hafnium silicate is applied, the amorphous first magnetic layer 13 can be easily formed, and the thickness of the first magnetic layer 13 can be increased.

Figure 2:
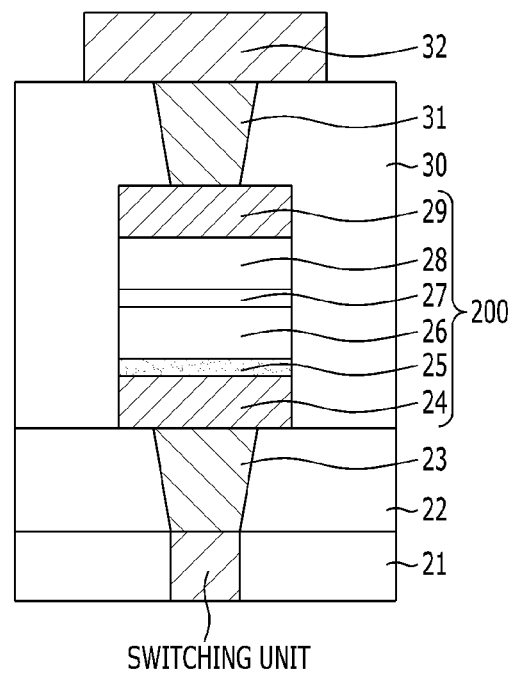
FIG. 2 is a cross-sectional view of a semiconductor device including a variable resistance element.

FIG. 2 is a cross-sectional view of a semiconductor device including a variable resistance element.

As illustrated in FIG. 2, the semiconductor device includes a substrate 21, a first interlayer dielectric layer 22, a first contact plug 23, a variable resistance element 200, a second interlayer dielectric layer 30, a conductive line 32, and a second contact plug 31. The substrate 21 includes a switching element (not illustrated). The first contact plug 23 is connected to the substrate 21 by penetrating the first interlayer dielectric layer 22. The variable resistance element 200 is connected to the first contact plug 23. The second interlayer dielectric layer 30 is buried between the variable resistance elements 200. The conductive line 32 is formed over the second interlayer dielectric layer 30. The second contact plug 31 connects the conductive line 32 with the variable resistance element 200. Furthermore, although not illustrated, the semiconductor device may further include a template layer and a coupling layer for improving the characteristic of the magnetic layers in the variable resistance element 200.

The variable resistance element 200 may have a stacked structure of a first electrode 24, a seed layer 25 containing conductive hafnium silicate, a first magnetic layer 26, a tunnel barrier layer 27, a second magnetic layer 28, and a second electrode 29. The seed layer 25, the first magnetic layer 26, the tunnel barrier layer 27, and the second magnetic layer 28 may have the same structure as the variable resistance element 100 of FIG. 1.

The first electrode 24, the second electrode 29, and the conductive line 32 may include a metallic layer. The metallic layer includes a conductive layer containing a metal element, and may include metal, metal oxide, metal nitride, metal oxynitride, metal silicide and the like.

The first electrode 24 may serve as a bottom electrode of the variable resistance element 200, and the second electrode 29 may serve as a top electrode of the variable resistance element 200. Furthermore, the second electrode 29 may serve to protect lower layers of the variable resistance element 200 during processes and serve as an etch barrier for patterning the lower layers. The second electrode 29 may be formed to a sufficient thickness to prevent a defective contact with the conductive line 32.

The semiconductor device in accordance with the implementation may further include the substrate 21 having a predetermined structure, for example, a switching element formed therein, the first interlayer dielectric layer 22 formed over the substrate 21, and the first contact plug 23 electrically connecting one end of the switching element to the variable resistance element 200 by penetrating the first interlayer dielectric layer 22. The variable resistance element may be formed over the first interlayer dielectric layer 22. Furthermore, the semiconductor device may further include the second interlayer dielectric layer 30 buried between the variable resistance elements 200, the conductive line 32 formed over the second interlayer dielectric layer 30, and the second contact plug 31 electrically connecting the variable resistance element 200 to the conductive line 32 by penetrating the second interlayer dielectric layer 30 over the variable resistance element 200.

The switching element serves to select a specific unit cell in the semiconductor device including a plurality of unit cells. The switching element may be provided in each of the unit cells, and may include a transistor, a diode and the like. One of the switching element may be electrically connected to the first contact plug 23, and the other end of the switching element may be electrically connected to a wiring (not illustrated), for example, a source line.

The first contact plug 23 and the second contact plug 30 may include a semiconductor layer or metallic layer, and the variable resistance element 200 may have a critical dimension (CD) or area greater than the first contact plug 23 and the second contact plug 30.

FIGS. 3A to 3E are cross-sectional view illustrating a method for fabricating a semiconductor device including a variable resistance element.

Figure 3A:
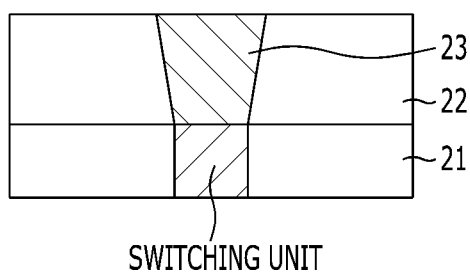
FIGS. 3A to 3E are cross-sectional view illustrating a method for fabricating a semiconductor device including a variable resistance element.

Referring to FIG. 3A, a substrate 21 having a predetermined structure, for example, a switching element (not illustrated) is provided. The switching element for selecting a specific unit cell in a semiconductor device including a plurality of unit cells may include a transistor, a diode and the like. One end of the switching element may be electrically connected to a first contact plug 23, and the other end of the switching element may be electrically connected to a wiring (not illustrated), for example a source line.

A first interlayer dielectric layer 22 is formed over the substrate 21. The first interlayer dielectric layer 22 may include a monolayer including oxide, nitride, and oxynitride or a stacked layer thereof.

A first contact plug 23 is formed to be electrically connected to one end of a switching element (not illustrated) by penetrating the first interlayer dielectric layer 22. The first contact plug 23 may serve to electrically connect the switching element and a variable resistance element to be formed through a subsequent process, and serve as an electrode for the variable resistance element, for example, a bottom electrode. The first contact plug 23 may be formed of a semiconductor layer or metallic layer. The semiconductor layer may include silicon. The metallic layer is a material layer containing a metal element, and may include metal, metal oxide, metal nitride, metal oxynitride, metal silicide and the like.

The first contact plug 23 may be formed through the following series of processes: the first interlayer dielectric layer 22 is selectively etched to form a contact hole exposing one end of the switching element, a conductive material is formed on the entire surface of the resultant structure so as to fill the contact hole, and an isolation process is performed to electrically isolate the adjacent first contact plugs 23. The isolation process may be performed by etching or polishing the conductive material formed on the entire surface of the resultant structure through a blanket etch process (for example, etch-back process) or chemical mechanical polishing (CMP) process, until the first interlayer dielectric layer 22 is exposed.

Figure 3B:
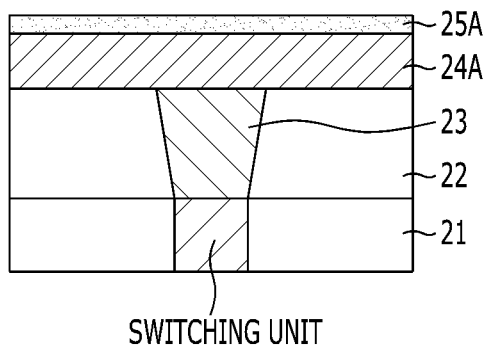

Referring to FIG. 3B, a conductive layer 24A is formed over the first interlayer dielectric layer 22 including the first contact plug 23. The conductive layer 24A may serve as a first electrode, for example, a bottom electrode, of a variable resistance element to be formed through a subsequent process, and may be formed of a metallic layer.

Then, a seed layer 25A containing conductive hafnium silicate is formed over the conductive layer 24A. The conductive hafnium silicate may be formed in an amorphous state. The conductive hafnium silicate may be formed to contain oxygen therein in order to improve the anisotropy energy of subsequent magnetic layers. At this time, the oxygen content of the conductive hafnium silicate may be controlled to range from 1% to 10%.

In one embodiment, the conductive hafnium silicate may be formed through a series of processes of forming a silicon containing layer, forming a hafnium containing layer, and performing a heat treatment. At this time, the silicon containing layer may include any one silicon containing layer including Si, SiB, SiO, or SiBO. The hafnium containing layer may include any one hafnium containing layer including Hf, HfO, or HfB.

In another implementation, the conductive hafnium silicate may be formed by forming hafnium silicide and then performing an oxidation process on the hafnium silicide. The hafnium silicide may include $Hf_xSi_y$ or $Hf_xSi_yB_z$ where x, y, and z are a composition ratio and a natural number, and may be formed through a co-sputtering method. Furthermore, the oxidation process may include any one oxidation process including natural oxidation, radical oxidation, or plasma oxidation.

The conductive hafnium silicate in accordance with the implementation is formed in an amorphous state. The conductive hafnium silicate may not be crystallized even at a high temperature of about 500° C., but may maintain an amorphous state. Thus, a magnetic layer to be formed through a subsequent process may also be formed to have an amorphous structure, and may prevent horizontal magnetic anisotropy from varying depending on crystallizability. Furthermore, the conductive hafnium silicate layer may suppress the crystallization of the magnetic layer, thereby increasing the thickness of the magnetic layer. Furthermore, even during a subsequent process, the conductive hafnium silicate may not be crystallized but still maintain a metallic state. Thus, lower resistance and higher TMR can be obtained as compared to the variable resistance element having the seed layer formed of an insulator. Since lower resistance is maintained during processes, it possible to improve the reliability of the element.

Figure 3C:
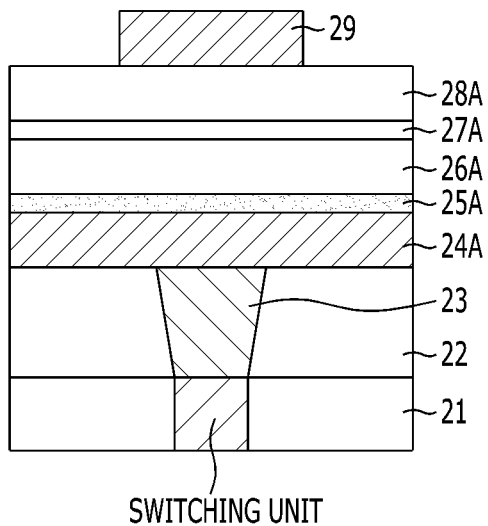

Referring to FIG. 3C, a first magnetic layer 26A, a tunnel barrier layer 27A, and a second magnetic layer 28A are stacked over the seed layer 25A containing the conductive hafnium silicate.

Any one of the first and second magnetic layers 26A and 28A may include a pinned ferroelectric layer of which the magnetization direction is pinned, and the other may include a free ferroelectric layer of which the magnetization direction is varied according to the direction of a current applied to the variable resistance element 200. The first and second magnetic layers 26A and 28A may include a monolayer or multilayer containing a ferromagnetic material, including, for example, Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy. The first and second magnetic layers 26A and 28A may further include impurities such as boron (B), but other implementations are possible.

In examples described herein, the first magnetic layer 26A is assumed to be a free magnetic layer. The first magnetic layer 26A may be formed to have an amorphous structure through the amorphous seed layer 25A, and the crystallization thereof may be suppressed as much as possible. Thus, the thickness of the first magnetic layer 26A may be increased so long as perpendicular magnetic anisotropy is maintained. Thus, the retention characteristic may be improved in proportion to the volume of the magnetic layer. Furthermore, when supposing that the first magnetic layer 26A contains CoFeB, oxygen within the seed layer 25A containing the conductive hafnium silicate layer and iron (Fe) of the first magnetic layer 26A may be coupled to each other at the interface therebetween, thereby reducing a damping constant. Thus, a switching current can be reduced.

The tunnel barrier layer 27A interposed between the two magnetic layers 26A and 28A may include a dielectric material, for example, metal oxide. The tunnel barrier layer 27A may change the magnetization direction of the free magnetic layer through electron tunneling. The tunnel barrier layer 27A may include a monolayer or multilayer containing a dielectric material, for example, oxide such as $Al_2O_3$, MgO, CaO, SrO, TiO, VO, NbO or the like. Other implementations are possible. The tunnel barrier layer 27A may be formed through physical vapor deposition or atomic layer deposition. The physical vapor deposition may include, for example, RF sputtering or reactive sputtering.

A second electrode 29 is formed over the second magnetic layer 28A. The second electrode 29 may be formed by forming a conductive layer over the second magnetic layer 28A and patterning the conductive layer through a mask pattern. In one implementation, a dry etch process may be performed.

The second electrode 29 may serve as a top electrode of a variable resistance element to be formed through a subsequent process, and may be formed of a metallic layer. Furthermore, the second electrode 29 may serve as an etch barrier for forming the variable resistance element.

Figure 3D:
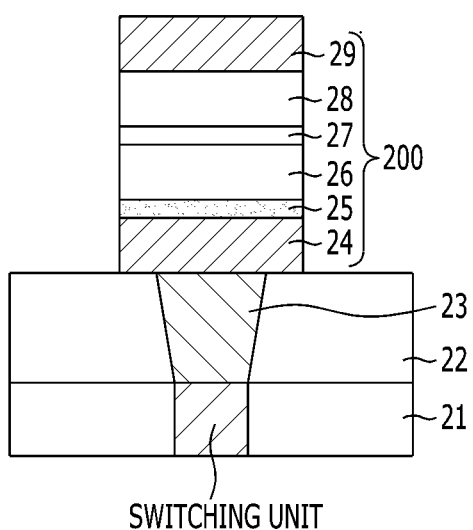

Referring to FIG. 3D, the second electrode 29 is used as an etch barrier to sequentially etch the second magnetic layer 28A, the tunnel barrier layer 27A, the first magnetic layer 26A, the seed layer 25A containing conductive hafnium silicate, and the conductive layer 24A. In other implementations, a mask pattern which is used for forming the second electrode 29 is not be removed and used as an etch barrier for forming the variable resistance element.

Then, the variable resistance element 200 is formed to have a stacked structure of the first electrode 24, the seed layer 25 containing conductive hafnium silicate, the first magnetic layer 26, the tunnel barrier layer 27, the second magnetic layer 28, and the second electrode 29. The variable resistance element 200 may be formed in a line shape extending in a direction where a conductive line extends, which will be formed in a subsequent process. Alternatively, a plurality of pillar-type variable resistance elements 200 may be arranged and spaced at a predetermined interval apart from one another in a direction where a conductive line extends. Furthermore, the variable resistance element 200 may be formed to have a CD or area sufficient to cover the first contact plug 23.

Although not illustrated, a spacer may be formed on sidewalls of the variable resistance element 200.

Figure 3E:
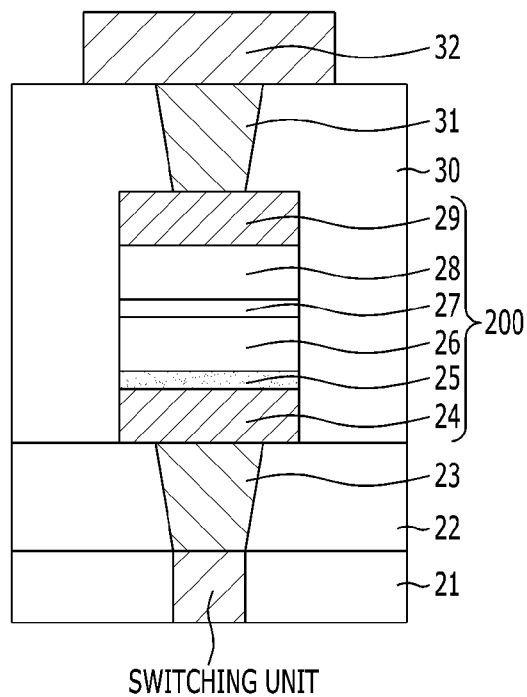

Referring to FIG. 3E, a second interlayer dielectric layer 30 is formed over the first interlayer dielectric layer 22. The second interlayer dielectric layer 30 may be formed to have a sufficient thickness to fill the space between the variable resistance elements 200. For example, the second interlayer dielectric layer 30 may be formed to have a thickness that the top surface thereof is positioned at a higher level than the top surface of the variable resistance element 200. The second interlayer dielectric layer 30 may be formed of the same material as the first interlayer dielectric layer 22. The second interlayer dielectric layer 30 may have a monolayer structure including oxide, nitride, or oxynitride or a stacked structure thereof.

Then, a second contact plug 31 is formed to be electrically connected to the variable resistance element 200 by penetrating the second interlayer dielectric layer 30 over the variable resistance element 200. The second contact plug 31 may serve to electrically connect the variable resistance element 200 to a conductive line to be formed in a subsequent process, and may serve as an electrode, for example, a top electrode, for the variable resistance element. The second contact plug 31 may be formed of a semiconductor layer or metallic layer. The semiconductor layer may include silicon, and the metallic layer is a material layer containing a metal element and may include metal, metal oxide, metal nitride, metal oxynitride, metal silicide or the like.

The second contact plug 31 may be formed through the following series of processes: the second interlayer dielectric layer 30 is selectively etched to form a contact hole exposing one end of the variable resistance element 200, a conductive material is formed on the entire surface of the resultant structure so as to fill the contact hole, and an isolation process is performed to electrically isolate the adjacent second contact plugs 31. The isolation process may be performed by etching or polishing the conductive material formed on the entire surface of the resultant structure through a blanket etch process (for example, etch-back process) or chemical mechanical polishing (CMP) process, until the second interlayer dielectric layer 30 is exposed.

Then, a conductive line 32 is formed over the second interlayer dielectric layer 30. The conductive line 32 is connected to the second contact plug 31, and electrically connected to the variable resistance element 200 through the second contact plug 31.

The above and other memory circuits or semiconductor devices based on the disclosed technology may be used in a range of devices or systems. FIGS. 4-8 provide some examples of devices or systems that may implement the memory circuits disclosed herein.

Figure 4:
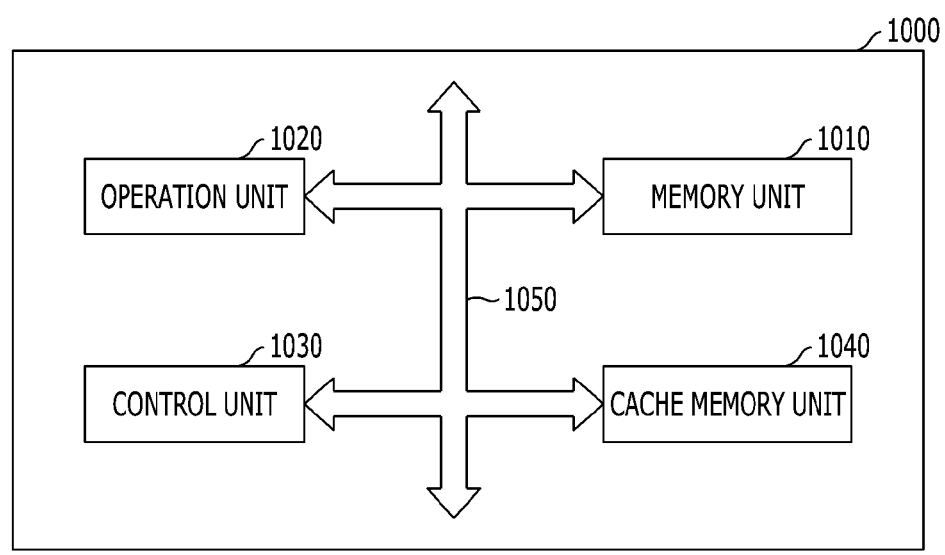
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit 1010 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the memory unit 1010 can be increased, and a fabricating process of the memory unit 1010 can be simplified. As a consequence, the size of the microprocessor 1000 becomes smaller.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
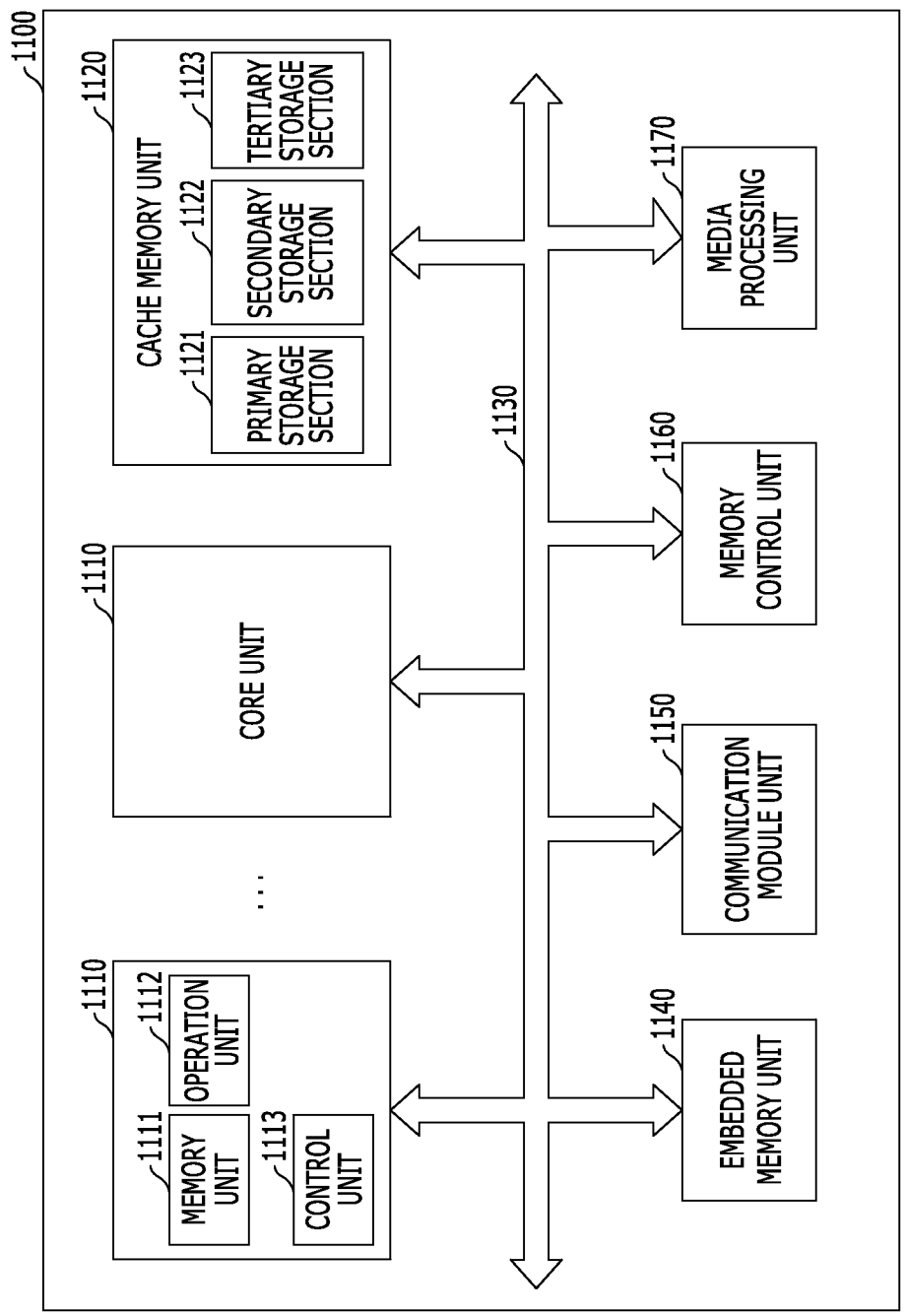
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the cache memory unit 1120 can be increased, and a fabricating process of the cache memory unit 1120 can be simplified. As a consequence, the size of the processor 1100 becomes smaller.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
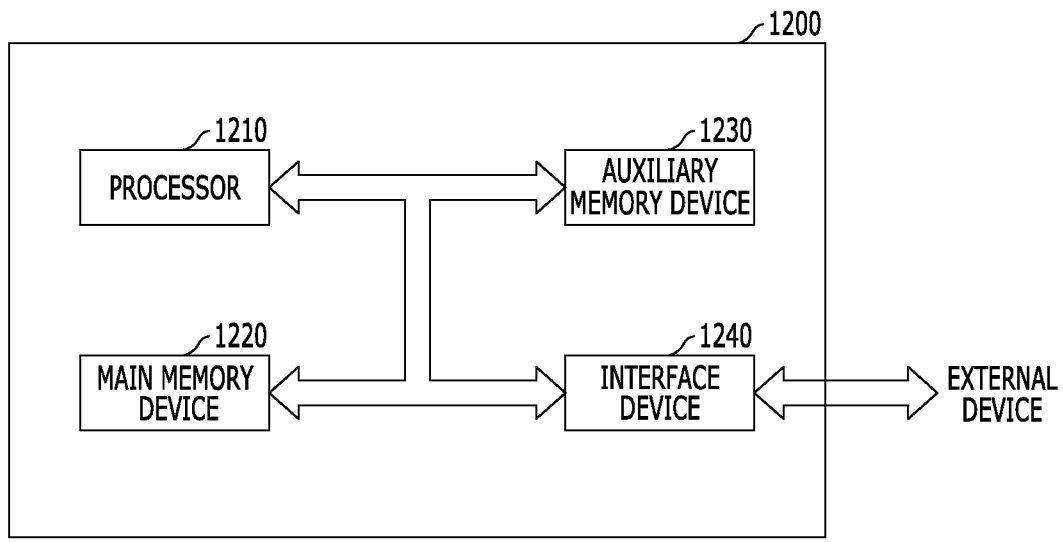
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described electronic devices in accordance with the implementations. For example, the main memory device 1220 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the main memory device 1220 can be increased, and a fabricating process of the main memory device 1220 can be simplified. As a consequence, the size of integration of the system 1200 becomes smaller.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off. The auxiliary memory device 1230 is a memory device for storing program codes or data. While the speed of the auxiliary memory device 1230 is slower than the main memory device 1220, the auxiliary memory device 1230 can store a larger amount of data.

The auxiliary memory device 1230 may include one or more of the above-described electronic devices in accordance with the implementations. For example, the auxiliary memory device 1230 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the auxiliary memory device 1230 can be increased, and a fabricating process of the auxiliary memory device 1230 can be simplified. As a consequence, the size of the system 1200 becomes smaller.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
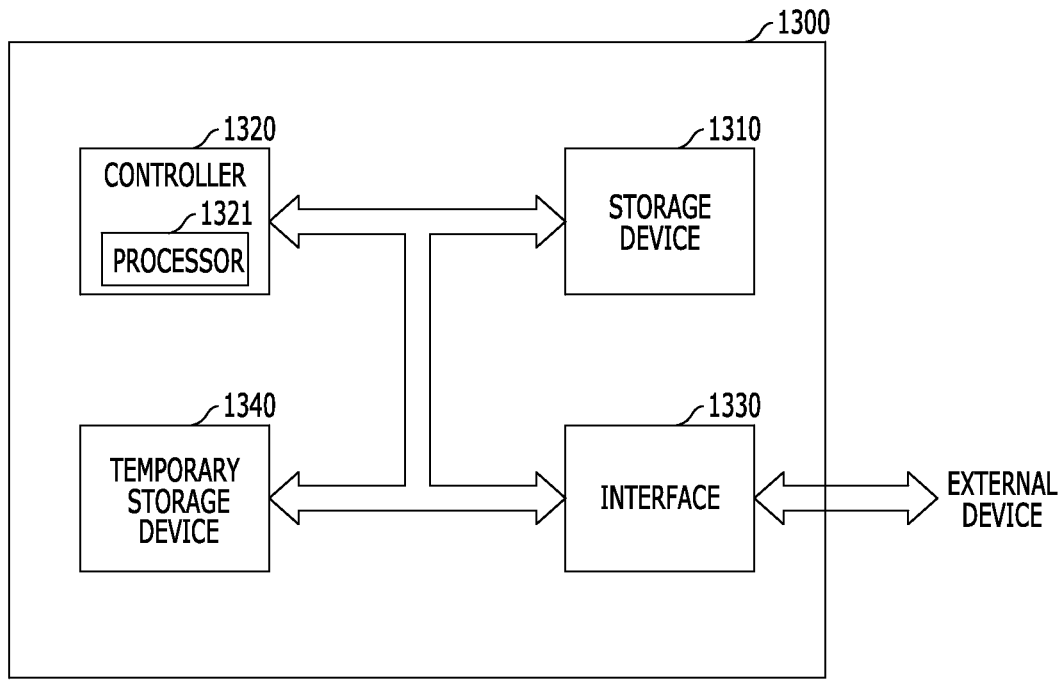
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. Any of the storage device 1310 and the temporary storage device 1340 for temporarily storing data may include one or more of the above-described electronic devices in accordance with the implementations. The storage device 1310 or the temporary storage device 1340 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the storage device 1310 and the temporary storage device 1340 can be increased, and a fabricating process of the storage device 1310 and the temporary storage device 1340 can be simplified. As a consequence, data storage characteristics of the data storage system 1300 are improved, and the size of the data storage system 1300 becomes smaller.

Figure 8:
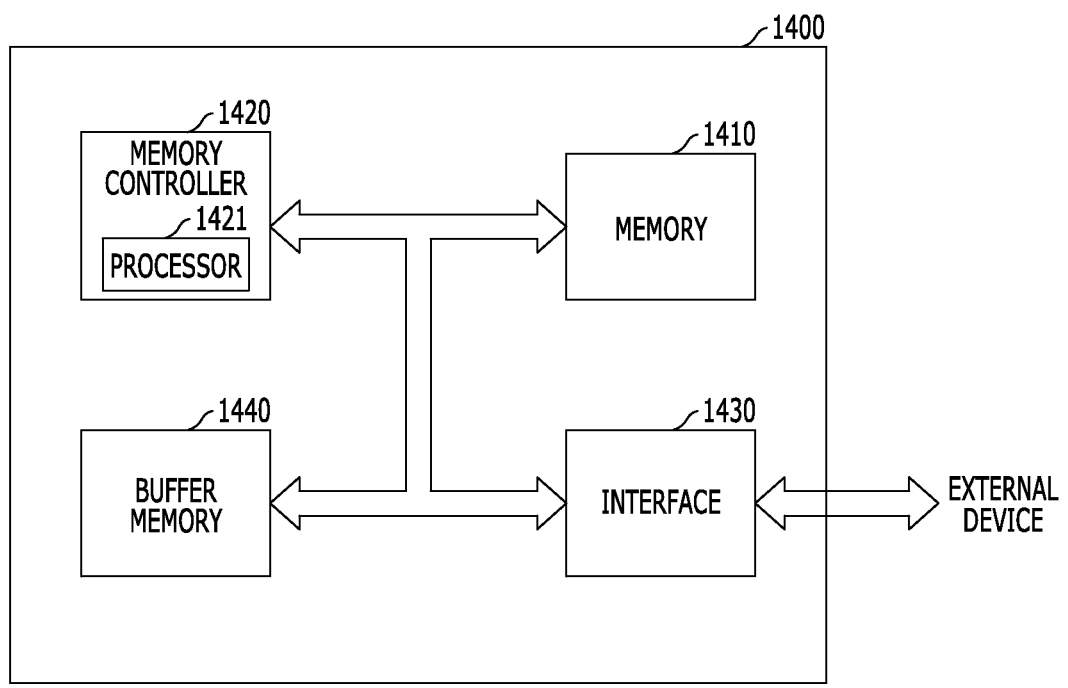
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the memory 1410 can be increased, and a fabricating process of the memory 1410 can be simplified. As a consequence, data storage characteristics of the memory system 1400 are improved, and the size of the memory system 1400 becomes smaller.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described electronic devices in accordance with the implementations. The buffer memory 1440 may include a seed layer containing conductive hafnium silicate; a first magnetic layer formed over the seed layer; a tunnel barrier layer formed over the first magnetic layer; and a second magnetic layer formed over the tunnel barrier layer. Through this, the degree of integration of the buffer memory 1440 can be increased, and a fabricating process of the buffer memory 1440 can be simplified. As a consequence, data storage characteristics of the memory system 1400 are improved, and the size of the memory system 1400 becomes reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with the implementations, it is possible to increase the integration degree of the device and improve the characteristic of the device.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
    an electrode providing an electrical contact for the semiconductor memory unit;
    a seed layer including conductive hafnium silicate which includes oxygen, and formed over the electrode;
    a first magnetic layer formed over the seed layer and the electrode;
    a tunnel barrier layer formed over the first magnetic layer; and
    a second magnetic layer formed over the tunnel barrier layer.

2. The electronic device according to claim 1, wherein the seed layer comprises amorphous conductive hafnium silicate.

3. The electronic device according to claim 1, wherein the conductive hafnium silicate has an oxygen content of 1% to 10%.

4. The electronic device according to claim 1, wherein the first magnetic layer comprises an amorphous magnetic material.

5. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit is a part of the memory unit in the microprocessor.

6. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is a part of the cache memory unit in the processor.

7. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory unit is a part of the auxiliary memory device or the main memory device in the processing system.

8. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory unit is a part of the storage device or the temporary storage device in the data storage system.

9. The electronic device according to claim 1, further comprising a memory system which includes:
    a memory configured to store data and conserve stored data regardless of power supply;
    a memory controller configured to control input and output of data to and from the memory according to a command inputted form an outside;
    a buffer memory configured to buffer data exchanged between the memory and the outside; and
    an interface configured to perform communication between at least one of the memory, the memory controller and the buffer memory and the outside,
    wherein the semiconductor memory unit is a part of the memory or the buffer memory in the memory system.

10. An electronic device comprising a semiconductor memory that includes:
    a substrate;
    an electrode formed over the substrate providing an electrical contact for the semiconductor memory;
    a variable resistance element formed over the substrate and including a sequentially stacked structure including a seed layer formed on the electrode, a first magnetic layer over the seed layer, a tunnel barrier layer over the first magnetic layer, and a second magnetic layer over the tunnel barrier layer;
    wherein the seed layer includes conductive hafnium silicate that includes oxygen and the first magnetic layer has a thickness greater than a thickness of the seed layer.

11. The electronic device according to claim 10, wherein the conductive hafnium silicate has an oxygen content of 1% to 10%.

12. The electronic device according to claim 10, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the memory unit that includes the variable resistance element is a part of the memory unit in the microprocessor.

13. The electronic device according to claim 10, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

14. The electronic device according to claim 10, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

15. An electronic device comprising a semiconductor memory that includes:

a variable resistance element;

a first contact plug positioned below the variable resistance element and providing an electrical connection between the variable resistance element and a switching element formed in a substrate; and a second contact plug being positioned above the variable resistance element and providing an electrical connection between the variable resistance element to a conductive line, wherein the variable resistance element comprises:

an electrode for providing an electrical contact for the semiconductor memory;

a seed layer including conductive hafnium silicate, and formed over the electrode, wherein the conductive hafnium silicate includes oxygen; and a first magnetic layer formed over the seed layer.

16. The electronic device according to claim 15, the variable resistance element further comprising:

a tunnel barrier layer formed over the first magnetic layer; and a second magnetic layer formed over the tunnel barrier layer, wherein the first magnetic layer has a thickness greater than a thickness of the seed layer.

17. The electronic device according to claim 15, wherein the conductive hafnium silicate has an oxygen content of 1% to 10%.

18. The electronic device according to claim 15, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is a part of the memory unit in the microprocessor.

19. The electronic device according to claim 15, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

20. The electronic device according to claim 15, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

* * * * *